(12) United States Patent
Lucas et al.

(10) Patent No.: US 8,441,323 B2
(45) Date of Patent: May 14, 2013

(54) SIGNAL PROCESSING USING TIMING COMPARISON

(75) Inventors: Mickael Lucas, Ifs (FR); Emeric Uguen, Domjean (FR)

(73) Assignee: NXP B.V., Eindhoven (NL)

( * ) Notice: Subject to any disclaimer, the term of this patent is extended or adjusted under 35 U.S.C. 154(b) by 149 days.

(21) Appl. No.: 13/119,289

(22) PCT Filed: Sep. 11, 2009

(86) PCT No.: PCT/IB2009/053984
§ 371 (c)(1),
(2), (4) Date: Mar. 16, 2011

(87) PCT Pub. No.: WO2010/032184
PCT Pub. Date: Mar. 25, 2010

(65) Prior Publication Data
US 2011/0169578 A1    Jul. 14, 2011

(30) Foreign Application Priority Data

Sep. 16, 2008 (EP) .................................... 08290868
May 28, 2009 (EP) .................................... 09290398

(51) Int. Cl.
*H03L 7/095* (2006.01)
(52) U.S. Cl.
USPC ................ 331/1 A; 331/16; 331/25; 327/156; 327/159
(58) Field of Classification Search .................. 331/1 A, 331/16, 25; 327/156, 159
See application file for complete search history.

(56) References Cited

U.S. PATENT DOCUMENTS 6,429,693 B1    8/2002    Staszewski et al.
7,271,666 B1    9/2007    Melanson
(Continued)

FOREIGN PATENT DOCUMENTS

| EP | 0 353 807 A1 | 2/1990 |
| EP | 1 178 609 A2 | 2/2002 |
| WO | 01/50611 A2 | 7/2001 |
| WO | 03/088485 A1 | 10/2003 |

OTHER PUBLICATIONS

Staszewski, R., et al. "All-Digital TX Frequency Synthesizer and Discrete-Time Receiver for Bluetooth Radio in 130-nm CMOS", IEEE J. of Solid-State Circuits, vol. 39, No. 12, pp. 2278-2291 (Dec. 2004).

(Continued)

*Primary Examiner* — Arnold Kinkead (57) ABSTRACT

A signal processing module with a timing comparator such as a time to digital converter is provided. The timing comparator comprises an error cancellation stage to remove a predicted effect of the imparted jitter from the timing comparator output signal. A jitter detector is used to detect the jitter from the comparator output signal, preferably residual jitter after the predicted effect of the jitter has been removed. Synchronous detection, such as correlation with the predicted jitter may be used to detect the jitter. The jitter detector adjusts a calibration factor of the timing comparator dependent on the detected jitter.

14 Claims, 3 Drawing Sheets

U.S. PATENT DOCUMENTS

| | | |
|---|---|---|
| 2003/0025565 A1 | 2/2003 | Takeda et al. |
| 2005/0094757 A1 | 5/2005 | Meninger et al. |
| 2005/0285685 A1 | 12/2005 | Frey |
| 2005/0285686 A1 | 12/2005 | Pettersen et al. |
| 2006/0033582 A1 | 2/2006 | Staszewski et al. |
| 2006/0238226 A1 | 10/2006 | Holland et al. |
| 2007/0075785 A1 | 4/2007 | Kossel et al. |
| 2007/0297488 A1 | 12/2007 | Chang |
| 2008/0042756 A1 | 2/2008 | Waheed et al. |
| 2008/0048791 A1 | 2/2008 | Fahim |
| 2008/0068236 A1 | 3/2008 | Sheba et al. |
| 2008/0069286 A1 | 3/2008 | Staszewski et al. |
| 2008/0072025 A1 | 3/2008 | Staszewski et al. |

OTHER PUBLICATIONS

Dudek, P., et al. "A High-Resolution CMOS Time to Digital Converter Utilizing a Vernier Delay Line", IEEE J. of Solid State Circuits, vol. 35, No. 2, pp. 240-247 (Feb. 2005).

Ramakrishnan, V., et al. "A Wide-Range, High-Resolution, Compact, CMOS Time to Digital Converter", $19^{th}$ Int'l. Conf. on VLSI Design, pp. 197-202 (Jan. 2006).

Tisa, S., et al. "Monolithic Time-to-Digital Converter With 20ps Resolution," Proc. of the $29^{th}$ European Solid-State Circuits Conference, pp. 465-468 (Sep. 2003).

International Search Report and Written Opinion for Int'l. Patent Application PCT/IB2009/053984 (May 7, 2010).

SIGNAL PROCESSING USING TIMING COMPARISON

TECHNICAL FIELD

The present application relates to a signal processing module comprising a timing comparator such as a time to digital converter. The present application relates also to a phase locked loop comprising such a signal processing module. The present application relates also to a consumer device comprising said module and to a method for calibration of timing comparison. The present application relates further to a computer readable medium having a computer program stored thereon. The computer program comprises instructions operable to cause a processor to perform said method.

BACKGROUND

In modern consumer devices, such as cellular or connectivity applications, synthesizer circuits are implemented for generating one or more signals having a desired output frequency. Due to the advantages of digital implementation, like low power consumption, testability, small required chip area and the like, synthesizer circuits can be preferably realized in the digital domain.

In general, the digital synthesizer circuits may comprise a digital phase-locked loop (DPLL) for controlling an oscillator, like a digitally controlled oscillator (DCO). More particularly, the output signal of the DCO can be controlled such that it maintains a desired relationship with an input reference signal. In particular, a desired frequency and/or phase relationship may be maintained. The output signal of the DCO is fed back to a timing comparator via a feedback frequency divider. The timing comparator is arranged to compare the timing of the reference signal supplied with that of the frequency divided DCO output signal. The timing comparator may be a phase detector for example, which may be implemented as a time-to-digital converter (TDC). The result of the timing comparison is used to adjust the DCO output frequency via a loop filter. Thus, a desired frequency and/or phase relationship between the reference signal and the output signal of the DCO can be maintained.

The frequency divider may be a fractional divider, which supports non-integer division ratios as well as integer division ratios. In this case the DPLL may comprise a delta sigma ($\Delta\Sigma$) modulator which receives a desired division ratio, which may be a rational number. This division ratio may be used to define to the desired output frequency. The delta sigma modulator generates a sequence of integers based on the desired divide ratio, so that the average of the integers equals the divide ratio. The integers from the sequence are used to control the actual division ratio of the frequency divider in a time dependent way according to the sequence. As a result, the DPLL will output a signal having an average frequency corresponding to the desired division ratio. However, while the average frequency output may be correct, phase errors may be introduced into the VCO/DCO output signal when the actual division ratio is not continuously equal to the desired division ratio. Thus the divider acts as a timing modulator that imparts jitter to the timing of the oscillator signal.

US 2005/0285685 A1 discloses a fractional-N phase locked loop having a first delta sigma modulator which is supplied with a divide value and which generates a divide control signal. The first delta sigma modulator integrates an error term indicative of a difference between a value of the generated divide control signal and the divide value supplied to the first delta sigma modulator. A phase error cancellation signal is generated by quantizing the integrated error term using a second delta sigma modulator. In one embodiment the error term is used in the second delta sigma modulator in the process of quantizing the integrated error term, thereby limiting the low pass filter effects of the second delta sigma modulator in the cancellation signal.

US 2005/0094757 A1 discloses methods and modules for reducing the phase noise generated in a fractional-N frequency synthesizer. In particular, it seeks to provide improved matching between a cancellation signal and a phase error signal. The methods are based on swapping phase signals to achieve the same average delay for each phase signal path, compensation and resynchronization of phase signals, and shuffling of digital-to analogue unit elements used to produce specific quantization levels. One method is based on digital gain compensation used to correct for frequency-dependent error arising from 25 differences between horizontal slicing quantization techniques and conventional vertical slicing techniques. It employs a combined phase detector and digital-to-analogue converter module.

However, the TDC 2 resolution may vary during processing of the consumer device due to process, temperature and voltage variations. Thus, the determined or measured phase jitter of the output signal of the DCO is inaccurate resulting in an inaccurate output signal of the DCO.

When phase cancellation is performed for example, it is desirable that the proportionality between timing differences and the resulting output signal values of the TDC matches the proportionality between predicted phase differences and the resulting prediction signal. If these two relations do not match, error cancellation will not be perfect. Similarly, when the TDC output is used as an absolute time or phase measurement, deviations between the ideally intended proportionality and the actual proportionality between timing differences and the resulting TDC output signal values lead to errors. Therefore it is desirable to provide at least for relative calibration of the proportion It is an object to provide for an improved fractional-N phase locked loops. Alternatively, or in addition, it is an object of to provide an improved module for calibrating and/or normalizing a timing comparator.

SUMMARY

A signal processing module as set forth in claim 1 is provided.

The signal processing module uses detection of the jitter that is imparted to the input signal of the timing comparator to calibrate the operation of the timing comparator. In an embodiment the jitter is synchronously detected using a predicted jitter signal as a reference, for example by determining a correlation between the output signal of the timing comparator and the predicted jitter. A calibration factor of the timing comparator is adjusted for example by adjusting reference time delays used in the timing comparator dependent on the detected jitter, and/or by adjusting a calibration factor applied to the output of the timing comparator dependent on the detected jitter and/or by adjusting the amplitude of the predicted jitter dependent on the detected jitter.

In an embodiment the detection of the jitter is used to regulate to zero a residual amplitude of the imparted jitter in the comparator output signal obtained by cancelling the predicted effect of the jitter on the comparator out put signal. The jitter may be detected in the comparator output signal from which the predicted effect of the jitter has been cancelled, in a control loop that adjusts the calibration of the timing comparator and/or the amplitude of the predicted jitter to regulate the residual jitter amplitude to zero. Any single factor or a combination of these factors may be adjusted to make the residual amplitude zero.

The timing modulator may comprise a frequency divider wherein variable adjustment of the division ratios imparts the jitter. In an embodiment the module may be used in a phase locked loop, wherein such a frequency divider may be used to set the output frequency. The present module may be a purely digital module. Further, it can be implemented in any consumer device requiring a synthesizing circuit. The timing comparator may be configured to detect a phase of the output signal of the digitally controlled oscillator (DCO). In general, a timing comparator such as a time to digital converter (TDC) can be used to control an oscillator device, in particular a DCO, such that a desired frequency and/or phase relationship between the reference signal and the output signal of the DCO can be maintained.

For an accurate calibration of the timing comparator, variation of the resolution of a time to digital converter (TDC), for instance due to process, temperature and voltage variations, is preferably prevented. It has been found that the resolution can be controlled through calibration. In more detail, the expected phase jitter is used together with the measured phase jitter for calibrating and/or normalizing the resolution of the TDC. In other words, the TDC is calibrated depending on the measured jitter and the calculated expected phase jitter.

The present application provides for an improved module that calibrates a TDC. Errors in the output signal of the DCO due to a variation of the resolution of the TDC can be at least reduced. The resolution of the TDC is the smallest measurable time unit. Furthermore, jitter is a generally undesired time dependent deviation between the phase of a signal and the phase of an ideal signal that has constant frequency under stable conditions.

The timing comparator compares a first input signal and a second signal. The second signal may be a reference signal supplied by a suitable signal generator, like a quartz oscillator. The timing comparator may be configured to detect a timing difference, like a frequency difference or preferably a phase difference, between the divided signal of the DCO and the reference signal. In particular, a phase jitter of the divided signal of the DCO can be determined easily by the comparison process.

Moreover, the time-to-digital converter may be configured to quantify the measured phase jitter of the output signal of the digitally controlled oscillator based on the resolution of the time-to-digital converter. Since the measured phase jitter depends on the resolution of the TDC, the measured phase jitter can be taken into account for calibrating the resolution of the TDC. More particularly, since the expected phase jitter can be calculated and the actual phase jitter can depend on the resolution of the time-to-digital converter, the relation between both phase jitters can be analyzed for determining the resolution variation, e.g. due to process, temperature and voltage variations. In other words, the resolution of the TDC can be normalized, in case the relation between the both phase jitters is detected.

A correlation unit may be used, which may be configured to correlate the determined error and the expected phase jitter of the output signal of the digitally controlled oscillator. For instance, the correlation unit may comprise two high pass filter configured to filter both the determined error signal and the calculated phase jitter. Subsequently, in each case a signum function can be arranged. It may be also possible to use the signals by themselves, the signum function being the ultimate simplification in term of bit implementation. The resulting signals can be combined to one signal by a successive multiplier. A simple digital mechanism for correlation of the respective signals is provided.

A further aspect of the present application is a consumer electronic comprising the above described module. The consumer electronic can be a RF module, like a cellular or connectivity application. For instance, the module according to the present application can be used for Bluetooth, global positioning module (GPS), digital video broadcasting terrestrial (DVB-T), wireless local area network (WLAN) and the like.

Another aspect of the present application is a method for calibration of timing comparison. Another aspect of the present application is a computer readable medium having a computer program stored thereon. The computer program comprises instructions operable to cause a processor to perform the above mentioned method.

BRIEF DESCRIPTION OF THE DRAWINGS

These and other aspects of the present patent application become apparent from and will be elucidated with reference to the following figures. The features of the present application and of its exemplary embodiments as presented above are understood to be disclosed also in all possible combinations with each other. The figures show.

DETAILED DESCRIPTION OF THE DRAWINGS

Exemplary embodiments will be described using an application to a phase locked loop with a timing comparator that is used as a phase detector to generate a signal that represents the phase difference between an oscillator output signal and a reference signal. Examples will be used wherein the phase locked loop contains a frequency divider between the oscillator and an input of the timing comparator and wherein the division ratio of the frequency divider may be varied to allow for non-integer average division ratios. In this way the frequency divider acts as a timing modulator that imparts jitter to its output signal. In different embodiments detection of the effect of this jitter on the output signal of the timing comparator is used in different ways to control calibration of timing comparison. Examples will be shown wherein the detected jitter is used to control the amplitude of jitter prediction, to control a correction factor of the timing comparison result and to control a reference time delay in the timing comparator respectively.

Figure 1:
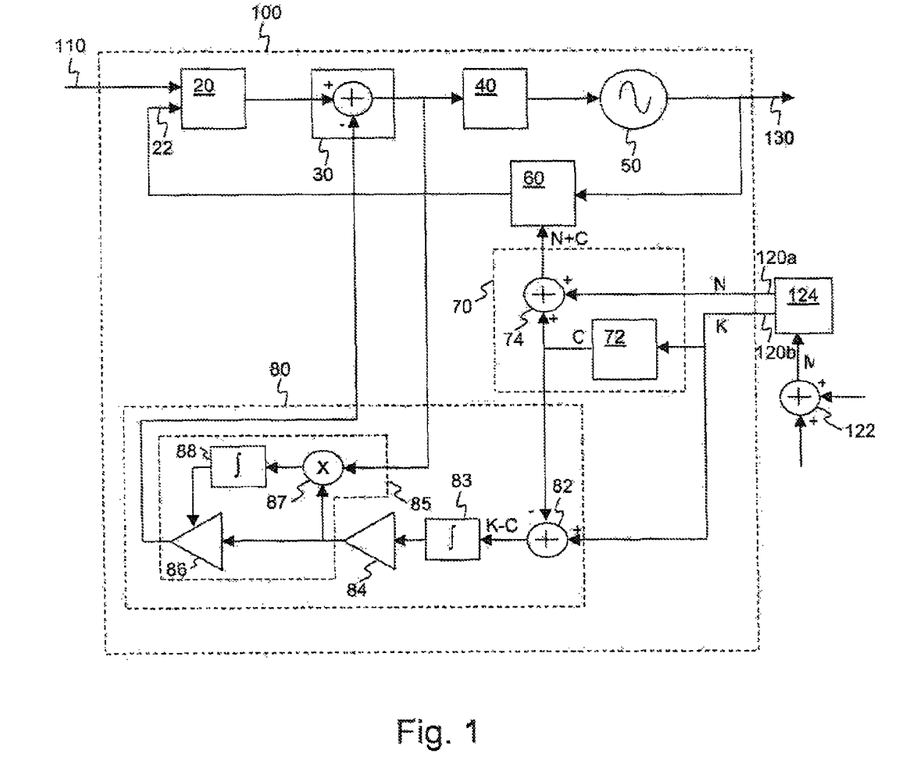
FIG. 1 a block schematic diagram including a fractional-N phase locked loop

Referring to FIG. 1, there is illustrated a fractional-N phase locked loop 100 comprising an input 110 for a reference signal and inputs 120a and 120b for a frequency control signal. The frequency control signal comprises a rational number M that corresponds to a desired ratio of the frequency Fref of the reference signal and the frequency Fosc of variable frequency oscillator 50. Conveniently the frequency control signal M may be expressed as N+K, where N is an integer divisional ratio and K is a desired fractional division ratio. In the embodiment of FIG. 1, input 120a is provided for the integer part N of the frequency control signal, and input 120b is provided for the fractional part K of the frequency control signal. A splitter 124 is provided for splitting the frequency control signal M into the constituent parts N and K. In a wireless transmitter, the frequency control signal may be dependent on the radio frequency channel being used, and also on a modulation signal that may be applied to modulate the frequency of the variable frequency oscillator. Therefore, in FIG. 1 the frequency control signal M may be provided by a summing stage 122 having a first input for a channel indication and a second input for a modulation signal.

The input 110 of the fractional-N phase locked loop 100 is coupled to a first input of a time-to-digital converter (TDC) 20 for delivering the reference signal to the TDC 20. The TDC 20 has a second input 22. The TDC 20 measures the phase difference between the reference signal and a signal applied at the input 22, and delivers at an output a phase error signal indicative of the phase difference. The output of the TDC 20 is coupled to a first input of a phase error cancellation stage 30. The phase error cancellation stage 30 has a second input for a compensation signal, and an output at which it provides a compensated phase error signal, which is the phase error signal compensated by subtraction of the compensation signal.

The output of the phase error cancellation stage 30 is coupled to an input of a loop filter 40, and an oscillator control signal is provided at an output of the loop filter 40. The output of the loop filter 40 is coupled to a control input of a variable frequency oscillator 50 for generating an oscillator signal having a frequency Fosc dependent on the oscillator control signal. An output of the variable frequency oscillator 50 is coupled to an output 130 of the fractional-N phase locked loop 100 and to an input of a variable divider 60 for dividing the frequency of the oscillator signal. The variable divider 60 has a control input for a division control signal that determines the division ratio of the variable divider 60. An output of the variable divider 60 is coupled to the second input 22 of the TDC 20 for delivering the divided oscillator control signal.

There is a division controller 70 having first and second inputs coupled to respectively the inputs 120a and 120b of the fractional-N phase locked loop 100, the first input for receiving the integer part N of the frequency control signal and the second input for receiving the fractional part K of the frequency control signal. The second input of the division controller 70 is coupled to an input of a modulator 72, which may be a delta sigma modulator that generates an overflow signal C at an output of the modulator 72 that is coupled to a first input of a summing stage 74. The first input of the division controller 70 is coupled to a second input of the summing stage 74. An output of the summing stage 74 is coupled to a first output of the division controller 70, which is coupled to the control input of the variable divider 60 for delivering the division control signal N+C. A second output of the division controller 70 is coupled to the output of the modulator 72 for delivering the overflow signal C.

There is a compensation determination stage 80 for determining the compensation signal and having a first input coupled to the input 120b of the fractional-N phase locked loop 100 for receiving the fractional part K of the frequency control signal. The compensation determination stage 80 has a second input coupled to the second output of the division controller 70 for receiving the overflow signal C, and a third input coupled to the output of the phase cancellation stage 30. The compensation determination stage 80 has an output coupled to the second input of the cancellation stage 30 for delivering the compensation signal.

The compensation determination stage 80 has a differencing stage 82 having first and second inputs coupled to, respectively the first and second inputs of the compensation determination stage 80 for determining a quantization error signal indicative of the quantization error in the division control signal. An output of the differencing stage 82 for delivering the quantization error signal is coupled to an input of an integrator 83. An output of the integrator 83 for delivering the integrated quantization error signal is coupled to a gain stage 84 for applying a predetermined gain to the integrated quantization error signal. The value of the predetermined gain is 1/(N.Fref.R) where R is the resolution of the time-to-digital converter (20).

The derivation of the predetermined gain 1/(N.Fref.R) may be expressed as follows. K is the desired fractional division ratio, and the instantaneous fractional division ratio is indicated by the overflow signal C of the modulator 70. Therefore, the quantization error signal, which represents the error in the division ratio, may be represented by K−C. Therefore the average quantization error introduced by the variable divider 60 under the control of the division controller 80 is an integral of (K−C). This average quantization error may be expressed in units of seconds by multiplying by the period of the reference signal, 1/(N.Fref), giving an average quantization error of the integral divided by (N.Fref). For a TDC 20 having a resolution of R seconds per least significant bit, this average quantization error will result in a numerical error in the TDC 20 digital output of the integral of (K−C) divided by a product (NF$_{ref}$R). Therefore, the compensation signal may be derived from the average quantization error (the integral of (K−C)) by applying a gain of 1/(N.Fref.R).

The output of the gain stage 84 may be used directly as the compensation signal. However, to ensure convergence of the compensated phase error signal despite rounding errors in digital elements of an embodiment, or process, voltage and temperature (PVT) variations which may result in the actual resolution of the TDC 20 differing from the intended value of R, it is desirable to include an adaptive gain stage 85 as illustrated in the embodiment of FIG. 1.

The adaptive gain stage 85 comprises a variable gain stage 86 having an input coupled to the output of the gain stage 84. The variable gain stage 86 has a control input for a gain control signal. The adaptive gain stage 85 also comprises a multiplier 87 having a first input coupled to the output of the gain stage 84 and a second input coupled the third input of the compensation determination stage 80 for receiving the compensated phase error signal. An output of the multiplier 87 is coupled to an input of an integrator 88, and an output of the integrator 88 is coupled to the control input of the variable gain stage 86 for delivering the gain control signal. An output of the variable gain stage 86 is coupled to the second input of the phase error cancellation stage 30.

The adaptive gain stage 85 is, in effect, an implementation of an iterative gain control algorithm in which the compensated phase error signal, at the third input of the compensation determination stage 80, is correlated in the multiplier 87 with an initial compensation signal at the output of the gain stage 84 to create a gradient, which may also be referred to as a correction value. The gradient is accumulated in the integrator 88 and the accumulated gradient modifies the gain applied to the control input of the variable gain stage 86. In one embodiment of the adaptive gain stage 85, only the sign of the compensated phase error signal and the sign of the signal at the output of the gain stage 84 is employed. Each of these signs may be derived by a zero crossing detector having a binary output. The multiplier need only employ these signs, and the integrator 88 may simply perform accumulation. Such an embodiment is simple to implement. The inclusion of the adaptive gain stage 85 enables the magnitude of the compensation signal to follow closely the magnitude of the phase error 30 signal to ensure the compensation phase error signal is zero.

The time-to-digital converter 20 generates a digital output signal indicative of a time difference between signals provided at its inputs. Time-to-digital converters are widely documented in the published literature so will not be described here. Examples of suitable time-to-digital converters are disclosed in the following publications: "A high-resolution CMOS time to digital converter utilizing a vernier delay line", P. Dudek, S. Szczepanski and J. V. Hatfield, IEEE Journal of Solid State Circuits, vol. 35, no. 2, pp. 240-247, Feb. 5, 2000; "A wide-wange, high-resolution, compact, CMOS time to digital converter", Ramakrishnan, V., Balsara, P. T, 19th International Conference on VLSI Design, 3-7 Jan. 2006, pp. 197-202; "Monolithic time-to-digital converter with 20 ps resolution", Tisa, S., Ltito, A., Guidice, A., Zappa, F., Proceedings of the 29th European Solid-State Circuits Conference, 16-18 Sep. 2003, pp. 465-468.

As stated above, the modulator may be a delta sigma modulator. Delta sigma modulators are widely documented in the published literature so will not be described here. Either or both of the integrator 83 and 86 may be a leaky integrator in order to avoid an offset due to a non-zero initial value. A low pass filter may be used as such a leaky integrator.

Figure 2:
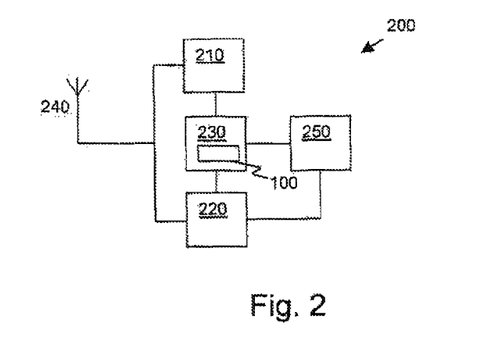
FIG. 2 a block schematic diagram of a wireless transceiver comprising a fractional-N phase locked loop FIG. 3 an embodiment of a phase measurement module FIG. 4 a flowchart of phase measurement FIG. 5 a time to digital converter FIG. 6 a digital phase-locked loop

Referring to FIG. 2, there is illustrated a block schematic diagram of a wireless communication device 200, such as a mobile telephone, comprising a transmitter 210 and receiver 220 each coupled to a frequency synthesizer 230 for generating a local oscillator signal. There is an antenna 240 coupled to an output of the transmitter 210 and to an input of the receiver 220. The frequency synthesizer 230 comprises a fractional-N phase locked loop 100 in accordance with the invention. There is a processor 250 coupled to the frequency synthesizer 230 for providing the frequency control signal, including an indication of a desired radio channel and desired modulation. The processor 250 is coupled to the receiver 220 for processing received data.

Any elements of the invention, excluding the variable frequency oscillator may be implemented using a digital signal processor (DSP), central processing unit (CPU), hard-wired digital circuitry, such as an application-specific integrated circuit (ASIC), or embedded software. Indeed, such elements of the invention can be implemented using computer program code or computer software. Such computer software or computer program code can be carried by a computer readable medium or by a signal such as an electronic signal over wires, an optical signal or a radio signal such as to a satellite or the like.

From reading the present disclosure, other variations and modifications will be apparent to the skilled person. Such variations and modifications may involve equivalent and other features which are already known in the art of phase locked loops, and which may be used instead of, or in addition to, features already described herein.

This can be summarized as follows. A fractional-N phase locked loop is provided that comprises:
a variable frequency oscillator (50) for generating an oscillator signal having a frequency dependent on an oscillator control signal;
a division controller (70) for generating a division control signal dependent on an integer part of a frequency control signal and on a fractional part of the frequency control signal;
a variable divider (60) for dividing the oscillator signal by a division ratio dependent on the division control signal to produce a divided oscillator signal;
a phase detector (20) for generating a phase error signal indicative of the phase difference between the divided oscillator signal and a reference signal;
a compensation determination stage (80) for determining a compensation signal dependent on a quantization error of the division control signal;
a phase error cancellation stage (30) for generating a compensated phase error signal dependent on the phase error signal and the compensation signal; and
a loop filter (40) for filtering the compensated phase error signal to generate the oscillator control signal; wherein
the phase detector (20) comprises a time-to-digital converter; and
the compensation determination stage (80) is adapted to determine the compensation signal dependent on the resolution of the time-to-digital converter (20).

Thus a fractional-N phase locked loop is provided in which a time-to-digital converter can be used as a phase detector for generating a phase error signal, and a compensation signal for compensating the phase error signal can be determined dependent on the resolution of the time-to-digital converter. By taking into account the resolution of the time-to-digital converter, the extent of compensation can be improved, thereby improving the noise performance of the fractional-N phase locked loop. In particular, a difference in gain in the feedback path from the output of the variable frequency oscillator to the output of the phase detector and in the generation of the compensation signal can be avoided or reduced.

In an embodiment of this phase locked loop the compensation determination stage (80) is adapted to determine the compensation signal inversely proportional to the resolution of the time-to-digital converter (20). This enables the dependence on the resolution of the time-to-digital converter to be provided in simple manner, by applying a constant value gain and expressing the compensation signal in units of the time-to-digital converter resolution.

Optionally the compensation determination stage (80) is adapted to determine the compensation signal proportional to an integral over a period of time of the quantization error of the division control signal. This can reduce the occurrence of abrupt changes in the compensation signal, thereby also contributing to reduced noise. Optionally the division controller (70) comprises a modulator (72) for generating an overflow signal dependent on the fractional part of the frequency control signal, and the division control signal comprises the overflow signal and the integer part of the frequency control signal. This enables a simple implementation of the modulator and division controller.

In a further embodiment the compensation determination stage (80) is adapted to determine the compensation signal proportional to an integral of (K–C) divided by a product $NF_{ref}R$, where N is the integer part of the frequency control signal, K is the fractional part of the frequency control signal, C is the overflow signal, the integral is over a period of time, Fref is the frequency of the reference signal, and R is the resolution of the time-to-digital converter (20). This can provide effective noise reduction.

Optionally the compensation determination stage (80) is adapted to determine the compensation signal dependent on the compensated phase error signal. This can enable convergence of the phase error signal despite the presence of variations in the resolution of the time-to-digital converter, or variations in other elements of the fractional-N phase locked loop, due to variations in analogue circuit performance caused by, for example, temperature changes, voltage changes or manufacturing process spread. Optionally the phase error signal, the compensation signal, and the compensated phase error signal each comprise a digital word, the loop filter (40) comprises a digital filter, and the variable frequency oscillator (50) comprises a digitally controlled oscillator. This enables the majority of the elements of the fractional-N phase locked loop to be digital, implemented using digital circuitry and/or embedded software, further reducing the susceptibility to variations in analogue circuitry and enabling more precise noise cancellation. In particular, the time-to-digital converter and the variable divider may be at least partially digital, and the phase error cancellation stage, loop filter and compensation determination stage may be fully digital.

The phase locked loop may be used in a radio communication apparatus (200). Also, a method of operating a fractional-N phase locked loop is provided that comprises:

generating an oscillator signal having a frequency dependent on an oscillator control signal;

generating a division control signal dependent on an integer part of a frequency control signal and on a fractional part of the frequency control signal;

dividing the oscillator signal by a division ratio dependent on the division control signal to produce a divided oscillator signal;

generating a phase error signal indicative of the phase difference between the divided oscillator signal and a reference signal;

determining a compensation signal dependent on a quantization error of the division control signal;

generating a compensated phase error signal dependent on the phase error signal and the compensation signal;

filtering the compensated phase error signal to generate the oscillator control signal; further comprising employing a time-to-digital converter (20) for generating the phase error signal; and determining the compensation signal dependent on the resolution of the time-to-digital converter (20).

In an embodiment the compensation signal is determined inversely proportional to the resolution of the time-to-digital converter (20). Optionally the compensation signal is determined proportional to an integral over a period of time of the quantization error of the division control signal. Optionally a modulator (72) may be employed for generating an overflow signal dependent on the fractional part of the frequency control signal, and comprising generating the division control signal dependent on the overflow signal and on the integer part of the frequency control signal. In a further embodiment the compensation signal is determined proportional to an integral of (K−C) divided by a product N F$_{ref}$R, where N is the integer part of the frequency control signal, K is the fractional part of the frequency control signal, C is the overflow signal, the integral is over a period of time, Fref is the frequency of the reference signal, and R is the resolution of the time-to-digital converter (20). Optionally the compensation signal is determined dependent on the compensated phase error signal. Optionally the phase error signal, the compensation signal, the compensated phase error signal and the oscillator control signal each comprise a digital word.

In the following detailed description, exemplary embodiments of the present application will describe and point out a module and method for calibrating a TDC.

In DPLLs, the whole-clock-domain quantization error can be corrected by means of a fractional error correction circuit, which is based on a TDC. The problem according to modules of prior art is that the resolution of the TDC may vary during processing, e.g. in dependence on process, temperature and voltage variations, resulting in an inaccurate output signal generated by a DCO. According to the present application, the resolution of the TDC is normalized during processing. In particular, the gain of the TDC can be calibrated. In the following, the relation between the gain of the TDC and its resolution is derived.

The arranged TDC measures the fractional delay difference between the reference signal and the divided output signal of the DCO. The resolution $\Delta t_{TDC}$ of the TDC, e.g. 10 ps to 40 ps depending on the respective standard, directly impacts phase noise at low offset as well as DPLL bandwidth (unit frequency) through the DPLL open loop gain.

By way of example, the single side band phase noise spectral density at the DCO output is given by $$L_{TDC} = \frac{1}{2} \cdot \frac{(2\pi)^2}{12} \cdot \left(\frac{\Delta t_{TDC}}{T_{DCO}}\right)^2 \cdot \frac{1}{f_{REF}}. \quad (a)$$

Furthermore, the DPLL open loop gain can be expressed by the following equation $$L(s) = \frac{K_d}{2 \cdot \pi \cdot f_{ref}} \cdot H(s) \cdot \frac{2 \cdot \pi \cdot K_o}{s} \frac{1}{N} = \frac{K_d \cdot K_o}{f_o} \cdot \frac{H(s)}{s}, \quad (b)$$

wherein $K_d$ is the TDC gain, in 1 sb/s, $K_o$ is the DCO gain, in Hz/1 sb, $f_{ref}$ is the PLL reference frequency TDCO is the DCO oscillation period and $f_o$ is the DCO oscillation frequency. It can be assumed that the TDC is based on a delay line with a unit delay of $dt_{tdc}$ resulting in the following equation $$K_d = \frac{1}{\Delta t_{tdc}}. \quad (c)$$

In other words, the resolution $\Delta t_{TDC}$ of the TDC depends directly on the gain of the TDC. A detailed elucidation for normalizing the resolution of the TDC such that process, temperature and voltage variations do not affect the processing of the DPLL will follow subsequently.

Figure 3:
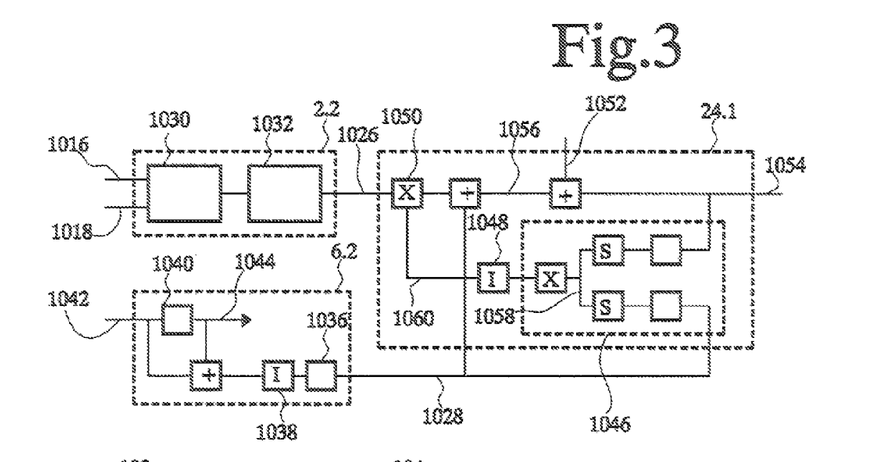

Referring to FIG. 3, an embodiment of a phase measurement module is shown. The shown embodiment comprises a TDC 2.2, a calculating unit 6.2 and a normalizing unit 24.1 in a detailed representation.

The TDC 2.2 receives at least two signals 1016 and 1018. More particularly, the TDC 2.2 receives a reference signal 1016, which can be provided by a suitable signal generator, like a quartz oscillator or the like. In addition, the TDC receives an output signal 1018 of the DCO via a divider (not shown).

Depending on these two signals 1016 and 1018, the TDC 2.2 may determine or measure a phase jitter of the output signal of the DCO. The measured phase jitter 1026 is forwarded by the TDC 2.2 to the normalizing unit 24.1.

Besides the measured phase jitter 1026, an expected phase jitter of the output signal of the DCO is calculated by the calculating unit 6.2. The calculating unit 6.2 may be a delta sigma (ΔΣ) noise cancellation unit. For instance, a predefined deterministic transfer function can be used for calculating the expected phase jitter 1028, wherein the transfer function may depend on a programmable resolution $\Delta t_{TDC}$ of the TDC. A more detailed elucidation of the calculation unit will follow subsequently.

Both the measured phase jitter 1026 and the expected phase jitter 1028 are received by the normalizing unit 24.1. The normalizing unit 24.1 is configured to calibrate the TDC 2.2. In other words, the normalizing unit 24 normalizes the resolution $\Delta t_{TDC}$ of the TDC 2.2 at least depending on the measured phase jitter 1026 and the expected phase jitter 1028.

The module according to the present application may work in the background or at a specified timeline. Undesired variations of the resolution of the TDC, which may occur due to e.g. process, temperature and voltage variations, are prevented by calibrating the resolution of the TDC.

The depicted TDC 2.2 encompasses an analyzer 1030 and a digitizer 1032. While the analyzer 1030 is arranged for comparing the received reference signal 1016 and the output signal, in particular the divided output signal 1018 of the DCO, the digitizer 32 may be configured to form a respective phase jitter signal 1026 depending on the results of the analyzer 1030.

As can be further seen from FIG. 3, the calculating unit 6.2, in particular a delta sigma (ΔΣ) noise cancellation circuit being already implemented within the DPLL, comprises a frequency to phase converting unit 1034 and a delta sigma (ΔΣ) modulator 1040. The frequency to phase converting unit 1034 includes at least an integrator 1038 and a filter 1036. The filter 1036 may be configured to determine the gain or resolution according to equations (a) to (c). As an input signal 1042 the calculating unit 6.2 may receive the divide ratio of the divider. Furthermore, besides an overflow 1044, the calculating unit 6.2 puts out the calculated expected phase jitter signal 1028 of the output signal of the DCO.

Moreover, the normalizing unit 24.1 encompasses among other a correlation unit 1046, an integrator 1048 and a multiplier 1050. Although multiplier 1050 is shown as part of normalization unit 24.1, it should be appreciated that it may also be regarded part of TDC 2.2, to provide a calibrated output of TDC 2.2. In addition to the two determined phase jitter signals 1026 and 1028, a control signal 1052 for creating a programmed offset can be received and processed by the normalizing unit 24.1. The resulting signal of the normalizing process is output for further processing and can be input to the digital filter of the DPLL.

Figure 4:
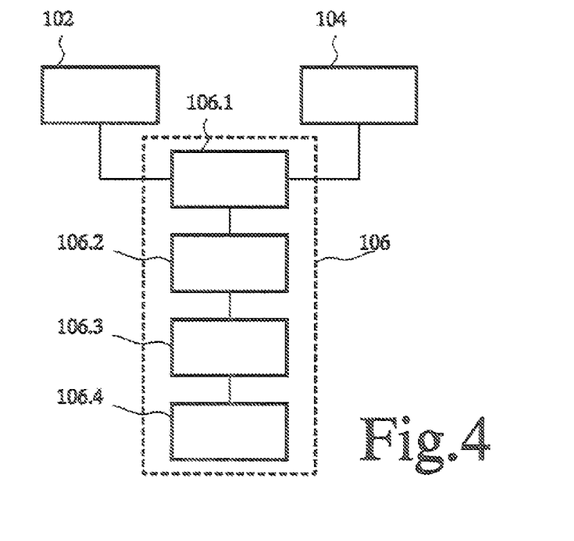

The functioning of the module according to FIG. 3 will be pointed out by the aid of FIG. 4. FIG. 4 shows a simplified flowchart of an embodiment of the method according to the present application.

In a first step 102, the TDC 2.2 may measure the phase jitter of the output signal of the DCO. More particularly, the TDC 2.2, in particular, the analyzer 1030 may compare the reference signal 1016 with the divided signal 1018 of the DCO. Both signals 1016 and 1018 may comprise the same frequency. However, the divided signal 1018 may comprise a phase jitter which depends on the delta sigma (ΔΣ) quantization in the present fractional N DPLL. The phase jitter can be expressed by the following equation $$\text{jitter} = \pm \text{granularity} \cdot 2^n \cdot T_{dco}, \quad (d)$$

wherein n=modulator order or the number of bits of the modulator overflow, granularity=minimum DCO period that the divider can count. For instance, if granularity=0.5 it means that the divider is able to count by half DCO period.

The TDC 2.2 may quantize the fractional delay difference between the reference signal 1016 and the DCO divided signal 1018 based on the resolution $\Delta t_{TDC}$ of the TDC 2.2. This resolution $\Delta t_{TDC}$ may vary with process, temperature and power supply due to its implementation, e.g. delay inverter.

In another step 104, which can be processed at the same time as step 102, the expected phase jitter is predicted digitally by the calculating unit 6.2 as it may be a deterministic delta sigma (ΔΣ) quantization error. It may be advantageous to use an already implemented delta sigma (ΔΣ) noise cancellation circuit as the calculating unit 6.2. The delta sigma (ΔΣ) noise cancellation circuit may comprise a deterministic transfer function which depends on a programmable resolution $\Delta t_{TDC}$. In other words, the transfer function and/or its values can be predefined depending on the employed TDC 2.2.

In a next step 106, the resolution $\Delta t_{TDC}$ of the TDC 2.2 is normalized depending on the measured phase jitter 26 of the divided output signal 18 of the DCO and the calculated expected phase jitter 28 of the output signal of the DCO. The normalizing step 106 can be divided into several sub-steps 106.1 to 106.4.

In a first sub-step 106.1, the expected phase jitter 1028 can be subtracted from the calculated phase jitter by an adder arranged in the normalizing unit 24.1 resulting in an error signal 1056. The addition of both digital words 26 and 28 will give a zero error signal if the actually resolution $\Delta t_{TDC}$ of TDC 2.2 comprises the same value as the digital preset resolution $\Delta t_{TDC}$. In this case, normalizing the resolution $\Delta t_{TDC}$ of the TDC can be omitted.

If this is not the case, e.g. the actually resolution $\Delta t_{TDC}$ of the TDC is changed during processing due to process, temperature and voltage variations, it is continued with the next sub-step 106.2. In this step, the error signal 1056 is correlated with the expected phase jitter 1028 or the measured phase jitter 1026 by a correlation unit 1046 arranged in the normalizing unit 24.1. If needed, an offset control signal 1052 can be added previously to the error signal 1056 without disturbing the TDC normalization. As can be seen from FIG. 3, the correlation unit 1046 may encompass two high pass filters, two signum filters and one multiplier for combining the signals. It shall be understood that, according to other variants of the present application, the signum filters can be also omitted resulting in a bit number increase.

Then, in a next sub-step 106.3, the correlated signal 1058 can be integrated by the provided integrator 1048. The resulting signal 1060 is used to modify the gain of the multiplier 1050. In sub-step 106.4, the integrated signal or integrated error 1060 is multiplied to the measured phase jitter 1026 to normalize the resolution $\Delta t_{TDC}$ through the multiplier 1050, e.g. a fractional multiplier.

Figure 5:
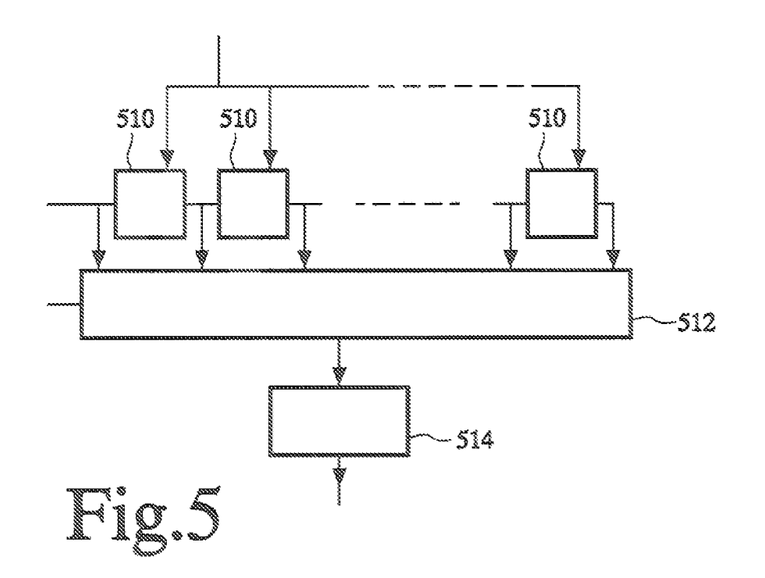

FIG. 5 shows an embodiment of a time to digital converter, comprising a chain of delay circuits 510, a sampling circuit 512 (e.g. a latch) and a converter 514. A first input of the time to digital converter is coupled to an input of the chain. Taps from the chain are coupled to inputs of sampling circuit 512, which in turn has outputs coupled to converter 514. Converter 514 may be part of digital signal processing circuit that also performs other functions. A second input of the time to digital converter is coupled to a sampling clock input of sampling circuit 512. Delay circuits 510 have delay control inputs. The delay control inputs are coupled in common. In an example of an embodiment the delay circuits may comprise current sources configured to charge capacitive loads. In this case the current sources may be switched on or off under control of the input and the size of the current and/or the capacitance value of the loads may be controlled from the control input. MOS transistors may be used as current sources for example. The chain of delay circuits 510 circuits may be implemented using a chain of logic inverters for example, a power supply input of the inverters being used as a delay control input to control the delay. The number of delay elements in the chain may be selected dependent on the required range of timing differences that has to be determined.

In operation a signal level change of the first signal from the first input propagates through the chain of delay circuits 510, giving rise to signal level changes at the taps at increasingly delayed time points. The signal levels at the taps are sampled at a time selected by a signal at the second input. At the time of sampling the signal level change will have traveled through a number of the delay circuits 510 dependent on the time interval between the arrival of the transition and the sampling time. The number can be determined from the sampling result.

This number of delay circuits 510 corresponds to the time interval divided by the delay of delay circuits 510. The calibration factor between this number and the length of the time interval can be adjusted by adjusting the delays of delay circuits 510. This may be done by varying the control signal at their delay control inputs. The control signal may be a power supply voltage or current applied to delay circuits 510 for example, or by controlling variable capacitances in the delay circuits 510.

Figure 6:
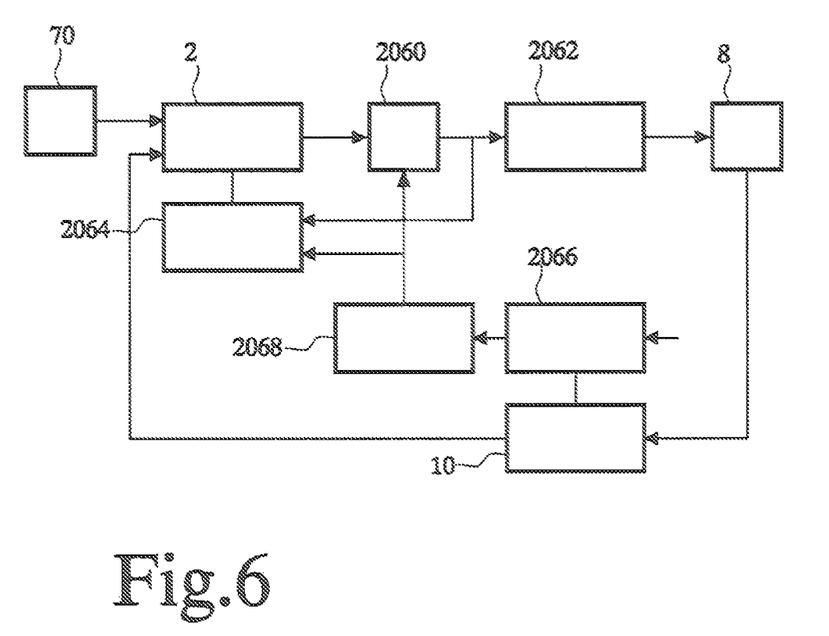

FIG. 6 shows a functional schematic for adjustment of the delays. This schematic comprises a subtractor 2060, a loop filter 2062, a jitter detector 2064, a delta sigma ($\Delta\Sigma$) modulator 2066 and a predictor 2068. Herein jitter detector 2064 has an output coupled to the control input of time to digital converter 2, to control the time delay of delay circuits 510. Jitter detector 2064 has inputs coupled to the subtractor 2060 and to the output of predictor 2068. Jitter detector 2064 may be realized as a correlator as shown in FIG. 3.

The output of time to digital converter 2 is coupled a first input of subtractor 2060, which in turn has an output coupled to an input of loop filter 2062. An output of loop filter 2062 is coupled to the frequency control input of oscillator 8. The circuit has a frequency selection input coupled to an input of delta sigma ($\Delta\Sigma$) modulator 2066, which in turn has an output coupled to the control input of frequency divider 10. The input and output of delta sigma ($\Delta\Sigma$) modulator 2066 are coupled to an input of predictor 28. Predictor 28 has an output coupled to a second input of first delta sigma ($\Delta\Sigma$) modulator. In operation the circuit locks oscillator 8 onto the signal from a signal source 70. Jitter detector 2064 measures the amplitude and sign of remaining jitter in the signal from the output of subtractor 2060 and uses the result of this measurement to control the time delay of delay circuits 510. In the circuit of FIG. 6 the jitter is introduced by switched control of the division ratio of divider 10. Subtractor 2060 is intended to remove this jitter. The amplitude and sign of the remaining jitter after subtractor 2060 depends on the calibration of time to digital converter 2. An explanation of this will be briefly repeated.

Time to digital converter 2 measures an indication of the phase difference between the signal from signal source 70 and a frequency divided version of the oscillator signal. The resulting phase difference dependent signal from time to digital converter 2 is filtered in loop filter 2062 and applied to the frequency control input of oscillator 8. As is know per se this causes oscillator 8 to lock to the signal from signal source 70, with a frequency ratio between their frequencies. This frequency ratio is determined by frequency divider 10.

Divider 10 and delta sigma ($\Delta\Sigma$) modulator 2066 realizes an adjustable ratio R between the frequencies of the signals from signal source 70 and oscillator 8 that may assume non-integer values. This ratio R is controlled from the frequency selection input. At this input a non-integer ratio may be signalled, for example a ratio R=N1/N2 of two integer values, where N1 is not an integer multiple of N2. Delta sigma ($\Delta\Sigma$) modulator 2066 converts the signalled non-integer ratio to a series of integer division factors M(t) that has a time average equal to the signalled non-integer ratio R. For example the integer division factors may jump back and forth between the nearest integers M1, M2 above and below the signalled non-integer ratio R, visiting them for respective fractions of time f1, f2 that provide for the desired average R=f1*M1+f2*M2. Delta sigma ($\Delta\Sigma$) modulation techniques that can provide for such a series of integer division factors are known per se. In an embodiment, delta sigma ($\Delta\Sigma$) modulator 2066 comprises a control unit that is configured to select the values M1, M2 that will be used, dependent on the desired division ratio. Any two values M1, M2 at a predetermined distance, lying on mutually opposite sides of the desired ratio R may be selected for example. Instead switching between a larger number of values may be used. In an embodiment delta sigma ($\Delta\Sigma$) modulator 2066 is part of a processing module that performs the selection of such values. The processing module may also perform the function of predictor 2068. The division ratio of divider 10 may be updated for example each time after counting a number of periods corresponding to the division ratio. However any other rate of changing the division ratio may be used.

Because switching between different integer division factors is used to approximate the desired division ratio on average, the phase of the signal from divider 10 has corresponding jumps relative to a notional signal that would correspond to the oscillator signal divided by the non-integer ratio R. These jumps will be called jitter. The jitter can be described by the increment in timing difference DT(i) between the actual signal from the divider and a notional signal with a frequency obtained by dividing the oscillator frequency by the desired ratio R. The increments DT(i) in the timing difference depend on the time point, indexed by "i". The overall timing difference T(i) between the actual signal and the notional signal is a sum of these increments T(i)=DT(i)+T(i−1). For ideal signals in a phase locked situation the increments DT(i) are predictable. At each time point t it is equal to the difference (M−R) between the integer division factor M used up to that time point t since the previous time point and the required non integer ratio R, multiplied by the period of the signal from signal source 70 in one period of oscillator 16.

Predictor 2068 computes a predicted output signal of time to digital converter 2 corresponding to the timing difference T(i) due to this predictable jitter, from the integer division factor and the required non integer ratio. The prediction may be computer from a previously observed timing difference by adding one or more increments DT(i) for example. Predictor 2068 signals this predicted jitter to subtractor 2060. Subtractor 2060 subtracts the predicted jitter T(i) from the signal D from time to digital converter 2. Under ideal circumstances the resulting difference D−T(i) is not affected by the jitter any more, but only by an idealized phase difference between the signal from signal source 70 and the notional signal obtained by dividing the frequency of signal from oscillator by the desired ratio R. Subtractor 2060 produces a series of output values whose average equals the result of the resulting difference, for use by loop filter 2062 to control oscillator 8.

However, the actual difference D−T(i) between the signal D from time to digital converter 2 and the predicted jitter T(i) also depends on the calibration of time to digital converter 2 and on noise. If the actual calibration factor C' of time delay measurement differs from the proper calibration factor C, the measurement will be off by a factor C/C', with the effect that the measured timing increments DT' due to switching between different integer division factors is off from the predicted phase jitter DT(t) by that factor: DT'=(C/C')*DT(t) and the output of subtractor 2060 contains a remaining increments of (C/C'−1)*DT(t). In the embodiment, time to digital converter 2 is used to perform a phase comparison, which means that a known calibration factor C is assumed to hold between the measured time delay and the phase difference DPHI. Thus, deviations of the calibration factor also result in remaining jitter in the measured phase.

The remaining jitter is used to correct the calibration of time to digital converter 2. Jitter detector 2064 measures the average sign and amplitude of remaining jitter signal. In the illustrated embodiment this is done by means of synchronous detection in jitter detector 2064, using a predicted jitter signal from predictor 2068. Synchronous detection may be performed for example by computing a correlation between the predicted increments DT(i) and increments of the actual converted timing signal that contains the remaining increments due to jitter (ideally $(C/C'-1)*DT(i)$), i.e. a time average of the product of these signals. The time average may be computed by applying integration or low pass filtering to the products for example. The part of the product that corresponds to jitter can be expressed as $(C/C'-1)*DT(i)^2$. The product may also contain a term due to real timing differences, but the effect of this term averages out, by low pass filtering or integrating the products and/or through the operation of the loop. The detection result is used to control the delay circuits 510 in order to realize a feedback loop that regulates this value to zero, i.e. to regulate C/C' to a value of one.

The factor $DT(i)^2$ or its time average may affect the loop gain of this feedback loop. In an embodiment, the feedback loop gain is adjusted for this factor, for example by including an amplifier with a controllable gain (not shown) between jitter detector 2064 and the control input of time to digital converter 2. Predictor 2068 may be configured to computes the inverse of $DT(i)^2$ or its average and feed it to a gain control input of the amplifier. In another embodiment delta sigma ($\Delta\Sigma$) modulator 2066 may be adapted to realize a predetermined average square jitter, i.e. a predetermined average value of $DT(i)^2$. The primary function of delta sigma ($\Delta\Sigma$) modulator 2066 is to select division ratio values M(i) for successive divisions so that the time average <M> of the values M(i) corresponds to the desired division ratio R. But this leaves delta sigma ($\Delta\Sigma$) modulator 2066 freedom to choose the values M(i) so that a predetermined average square deviation $(M(i)-R)^2$ is realized. For example if the average is realized by switching between integer division ratios M1 and M2 it suffices to control the fractions of time f1, f2 during which these ratios M1 and M2 are realized, so that $R=f1*M1+f2*M2$. At the same time the average square deviation is $f1*(M1-R)^2+f1*(M1-R)^2$, which can be adjusted by selecting M1 and M2. In another embodiment, as shown in FIG. 3, only the sign of the predicted and actual timing differences may be correlated. This removes amplitude dependence.

In an embodiment delta sigma ($\Delta\Sigma$) modulator 2066 is configured to use successively different values M(i) of the division factor even if R has an integer value, in order to provide for jitter for use to adjust the calibration factor.

In summary a calibration of time or phase measurement is realized by using a jitter component in the result of the comparison between two signals of which the relative time delay or phase difference is measured. An embodiment has been shown wherein the jitter is introduced by means of a frequency divider that serves as a timing modulator to produce one of these two signals with jitter by varying the frequency division ratio. Instead, or in addition, a frequency divider that acts as a timing modulator in this way could be used to produce the reference signal. Moreover, alternative or in addition to jitter introduced by frequency division, the jitter may be any variable signal timing component. Instead of introducing jitter with a frequency divider any other method of introducing jitter may be used, for example a delay element in one of the signal paths that is controlled to impart intentionally varying, or switched, delays. In this case the jitter may be periodic or have any other type of waveform as it is not bound by the required division ratio. However, the use of the divider has the advantage that a digital component can be used that may be present anyway in a PLL circuit.

Although an embodiment has been shown wherein a synchronous jitter detector 2064 has been used that detects both sign and amplitude of the jitter, it should be appreciated that another type of detector may be used. Preferably at least the sign with which the predicted jitter returns is determined, so as to facilitate feedback control. A binary correlator such as shown in FIG. 3 may be used or a correlator that uses a higher amplitude resolution, for example by using a larger number of bits. In an alternative a detector with a band filter that selects a frequency component of the signal from subtractor 2060 in a frequency band in which the jitter is known to occur, followed by detection of the filtered signal and use of the detected signal for calibration. In this case use of the predicted error in the jitter detection may not be needed. For example if the filter is applied to a signal obtained between time to digital converter 2 and subtractor 2060, the feedback loop may be configured to regulated the detected jitter amplitude to a predetermined value, corresponding to calibrated operation. However, as the predicted jitter signal is readily available a faster and more accurate detection can be realized with little overhead, using synchronous detection such as correlation.

As shown, the calibration of the time measurement may be realized by multiplying an output signal of time to digital conversion by a factor or by controlling time delays in a chain of delay circuits. A combination of both may be used. Alternatively, the amplitude of the predicted jitter may be adjusted. Although an embodiment has been shown with a subtractor 2060 to remove the jitter, it should be appreciated that alternatively the jitter may be removed by filtering, with or without using a subtractor or that jitter detector 2064 may use a signal between the time to digital converter and the subtractor as input. In this case, the feedback using jitter detection is preferably configured to regulate jitter amplitude to a predetermined value. Although an embodiment has been shown wherein a delta sigma ($\Delta\Sigma$) modulator 2066 with a feedback loop has been used to select the division ratios, it should be appreciated that any other technique may be used to select the series of division factors. A feed forward technique may be used. For example, the division factors may be computed by computing a function of the required ratio R and time that provides for an average approximating the required ratio R. Although an embodiment has been shown wherein a time to digital converter that measures delay times is calibrated, it should be appreciated that a similar calibration using jitter in the signals may be applied other types of time to digital converters such as phase detectors that measure phase of a signal, which corresponds to time when the signal frequency is taken to be known.

It should be appreciated that this form of calibration makes it possible to perform most required operations by means of digital operations, which do not depend on accurate analog circuits. In an embodiment a programmed signal processing circuit may be used to perform several of the operations. For example selection of the division factors as well as error prediction may be performed by such a digital signal processing circuit. Also, loop filtering subtraction etc. may be performed in such a digital signal processing circuit. As such the figures should be viewed as functional schematics showing modules that may be implemented as software modules with instructions to be executed by a programmable signal processor, or sub-circuits wired to perform these functions.

It shall be understood that according to other variants of the present application, the particular implementation of the described components, such as calculating unit or normalizing unit may be different.

According to the present application, a continuous process is provided, which may run in the background, resulting in that the TDC resolution $\Delta t_{TDC}$ is normalized with a preset digital word for resolution as a reference.

The present application provides for an improved delta sigma ($\Delta\Sigma$) noise cancellation and a better suppression of DCO fractional spurs due to an improved matching of the deterministic phase error. Moreover, the present module is implemented completely in the digital domain and besides no DC offset dependency, no time delay constraints are provided. In addition, the required silicon area is small and a delta sigma ($\Delta\Sigma$) noise cancellation circuit can be re-used for another function resulting in low costs.

Furthermore, it is readily clear for a person skilled in the art that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A signal processing module, comprising:
   a timing modulator configured to form a first input signal by imparting jitter to a timing of features of the first input signal;
   a timing comparator with inputs for the first input signal and a second input signal, configured to generate a timing comparator output signal representing relative timing of features of the first input signal with the imparted jitter and the second input signal, the timing comparator comprising an error cancellation stage with an input coupled to the timing modulator, configured to remove a predicted effect of the imparted jitter from the timing comparator output signal; and
   a jitter detector configured to detect the jitter from the comparator output signal, the jitter detector having an output coupled to the timing comparator to adjust a calibration factor of the timing comparator dependent on the detected jitter.

2. A signal processing module according to claim 1, wherein the jitter detector has an input for a jitter prediction signal indicating said predicted effect of the imparted jitter, the jitter detector being configured to detect the jitter in the comparator output signal synchronized by variation of the jitter prediction signal.

3. A signal processing module according to claim 2, wherein the jitter detector comprises a correlator configured to determine a correlation factor between the comparator output signal and the jitter prediction signal.

4. A signal processing module according to claim 1, wherein the jitter detector is configured to detect a residual jitter amplitude in the timing comparator output signal from which the predicted effect of the jitter has been removed and to drive residual jitter amplitude to zero by adjusting the calibration factor.

5. A signal processing module according to claim 1, wherein the timing comparator comprises a multiplying circuit configured to apply the calibration factor to the predicted effect of the jitter, the output of the jitter detector being coupled to the multiplying circuit to set the calibration factor.

6. A signal processing module according to claim 1, wherein the timing comparator comprises a multiplying circuit configured to apply the calibration factor to the comparator output signal, the output of the jitter detector being coupled to the multiplying circuit to set the calibration factor.

7. A signal processing module according to claim 1, wherein the timing comparator comprises a time to digital converter with a controllable time delay circuit and a sampling circuit with a sampling clock input and a signal input, the signal input being coupled to an output of the time delay circuit, one of an input of the time delay circuit and the sampling clock input being coupled to receive the first input signal and the other one of the input of the time delay circuit and the sampling clock input being coupled to receive the second input signal, the jitter detector being coupled to a delay control input of the time delay circuit to adjust the calibration factor by adjusting the delay of the delay circuit.

8. A signal processing module according to claim 1, wherein the timing modulator comprises
   a frequency divider with a signal input configured to receive a further input signal and a signal output coupled to an input of the timing comparator for supplying the first input signal as a frequency divided version of the further input signal; and
   a division ratio selector configured to vary a division ratio of the frequency divider as a function of time, whereby the jitter in the first input signal results from the variation of the division ratio, the error cancellation stage being configured to determine the predicted effect from the variation of the division ratio.

9. A signal processing module according to claim 8, wherein the division ratio selector comprises a delta sigma modulator with an input for receiving a selection of an average division ratio, the delta sigma modulator being configured to switch the division ratio of the frequency divider between different integer division ratios under control of a feedback loop for equalizing a time average of the integer division ratios to the selection of the average division ratio.

10. A signal processing module according to claim 1, further comprising a digitally controlled oscillator with an output coupled to the frequency divider to supply the further input signal, an output of the timing comparator being coupled to a control input of the digitally controlled oscillator, realizing a feedback loop to control the digitally controlled oscillator.

11. A consumer electronic device comprising the module according to claim 1.

12. A method of calibrating a timing comparison, the method comprising:
- causing a timing modulator to impart jitter to timing of a first input signal;
- using a timing comparator to obtain a comparator output signal representing relative timing of features of the first input signal with the imparted jitter and a second input signal;
- predicting an effect of the imparted jitter on the comparator output signal;
- cancelling the predicted effect from the comparator output signal;
- detecting the imparted jitter from the comparator output signal; and
- adjusting a calibration factor of the timing comparator and/or the prediction of the effect of the jitter, dependent on the detected jitter.

13. A non-transitory computer readable medium having a computer program stored thereon, the computer program comprising instructions operable to cause a processor to perform a method according to claim 12.

14. The signal processing module of claim 1, wherein the timing modulator comprises a variable divider configured to form the first input signal by imparting jitter to an output signal of the variable divider.

* * * * *